US008750065B2

(12) United States Patent
Merkel et al.

(10) Patent No.: US 8,750,065 B2
(45) Date of Patent: Jun. 10, 2014

(54) THERMAL MANAGEMENT APPARATUSES WITH TEMPERATURE SENSING RESISTIVE RANDOM ACCESS MEMORY DEVICES AND METHODS THEREOF

(75) Inventors: Cory Merkel, Rochester, NY (US); Dhireesha Kudithipudi, Rochester, NY (US)

(73) Assignee: Rochester Institute of Technology, Rochester, NY (US)

( * ) Notice: Subject to any disclaimer, the term of this patent is extended or adjusted under 35 U.S.C. 154(b) by 231 days.

(21) Appl. No.: 13/536,675

(22) Filed: Jun. 28, 2012

(65) Prior Publication Data

US 2013/0003438 A1      Jan. 3, 2013

Related U.S. Application Data

(60) Provisional application No. 61/501,906, filed on Jun. 28, 2011.

(51) Int. Cl.
*G11C 7/04* (2006.01)
(52) U.S. Cl.
USPC ............... 365/211; 365/148; 365/189.14
(58) Field of Classification Search
USPC .................................. 365/211, 148, 189.14
See application file for complete search history.

(56) References Cited

U.S. PATENT DOCUMENTS 7,593,278 B2 *   9/2009   Hu et al. ................... 365/211

OTHER PUBLICATIONS

L. Chua, "Memristor—The Missing Circuit Element," IEEE Trans. on Circuit Theory, vol. 18, No. 5, pp. 507-519, Sep. 1971.
L. Chua, et al., "Memristive Devices and Systems," Proc. of the IEEE, vol. 64, No. 2, pp. 209-223, Feb. 1976.
D. Strukov et al., "The Missing memristor found," Nature, vol. 453, pp. 80-83, May 2008.
Q. Xia et al., "Memristor-CMOS Hybrid Integrated Circuits for Reconfigurable Logic," Nano Letters, vol. 9, No. 10, pp. 3640-3645, 2009.
M. Stork et al., "Memristor Based Feedback System," Applied Electronics, 2009, pp. 237-240, Sep. 2009.
S. H. Jo et al., "Nanoscale Memristor Device as Synapse in Meuromorphic Systems," Nano Letters, vol. 10, No. 4, pp. 1297-1301, 2010.
F. Merrikh-Bayat et al., "Bottleneck of using single memristor as a synapse and its solution," arXiv:1008.3450v2, Sep. 2010.
F. Argall, "Switching Phenomena in Titanium Oxide Thin Films," Solid-State Electronics, vol. 11, pp. 535-541, 1968.

(Continued)

*Primary Examiner* — Son Dinh
*Assistant Examiner* — Nam Nguyen
(74) *Attorney, Agent, or Firm* — Joseph M. Noto; Bond Schoeneck & King PLLC (57) ABSTRACT

An apparatus includes one or more temperature sensing and memory devices each having one or more memristors. A controller device is coupled to the temperature sensing and memory devices A processing device is coupled to the controller device and includes at least one of hardware logic configured to be capable of implementing or a processor coupled to a memory and configured to execute programmed instructions stored in the memory comprising: issuing a record instruction and a write instruction with a write address to the controller device to record the write time for the memristor at the write address to transition from one of the first and second states to the other states; receiving from the controller device the recorded time; determining and providing a temperature of the memristor at the write address based on the received write time.

28 Claims, 7 Drawing Sheets

(56) References Cited

OTHER PUBLICATIONS

J. Blanc et al., "Electrocoloration in SrTiO3: Vacancy Drift and Oxidation-Reduction of Transition Metals," Physical Review B, vol. 4, No. 10, Nov. 15, 1971.

Y. Dong et al., "Si/a-Si Core/Shell Nanowires as Nonvolatile Crossbar Switches," Nano Letters, vol. 8, No. 2, pp. 386-391, 2008.

S. H. Jo et al., "High-Density Crossbar Arrays Based on a Si Memristrive System," Nano Letters, vol. 9, No. 2, pp. 870-874, 2009.

J. J. Yang et al., "Memristive switching mechanism for metal/oxide/metal nanodevices," Nature Nanotechnology, vol. 3, No. 7, 2008.

M. D. Pickett et al., "Switching dynamics in titanium dioxide memristive devices," Journal of Applied Physics, vol. 106, No. 7, pp. 07458-1-07458-6, Oct. 2009.

Y. V. Pershin et al., "Spin memristive systems: Spin memory effects in semiconductor spintronics," Physical Review B, vol. 78, No. 11, pp. 113309-1-113309-4, Sep. 2009.

F. Y. Wang, "Memristor for introductory physics," arXiv:0808.0286v1, Sep. 2008.

Y. N. Joglekar et al., "The elusive memristor properties of basic electrical circuits," arXiv:0807.3994v2, Eur. J. Phys., vol. 30, No. 661, Jul. 2009.

D. Strukov et al., "Coupled Ionic and Electronic Transport Model of Thin-Film Semiconductor Memristive Behavior," Small, vol. 5, No. 9, pp. 1058-1063, 2009.

U. Weinert et al., "Generalized Nerst-Einstein relations for nonlinear transport coefficients," Physical Review B, vol. 21, No. 2, pp. 681-690, Feb. 1990.

D. Strukov et al., "Exponential ionic drift: fast switching and low volatility of thin-film memristors," Applied Physics A, vol. 94, pp. 515-519, 2009.

S. Benderli et al., "On SPICE macromodelling of TiO2 memristors," Electronic Letters, vol. 45, No. 7, pp. 377-379, Mar. 26, 2009.

Z. Biolek et al., "SPICE Model of Memristor with Nonlinear Dopant Drift," Radioengineering Journal, vol. 30, No. 4, pp. 210-214, 2010.

S. Shin et al., "Compact Models for Memristors Based on Charge-Flux Constitutive Relationships," IEEE Trans Compt Aided Dsgn Integrated Circuits & Sys, vol. 29, No. 4, Apr. 2010.

A. Rak et al., "Macromodeling of the Memristor in SPICE," IEEE Trans. Computer Aided Design of Integrated Circuits & Systems, vol. 29, No. 4, Apr. 2010.

R. Pino et al., "Compact Method for Modeling and Simulation of Memristor Devices," IEEE/ACM International Symposium on Nanoscale Architecture, pp. 1-4, Jun. 2010.

S-J. Choi et al., "Synaptic behaviors of a single metal-oxide-metal resistive device," Applied Physics A, vol. 102, pp. 1019-1025, 2011.

J. G. Simmons, "Conduction in thin dielectric films," J. Phys. D: Appl. Phys., vol. 4, pp. 613-657, 1971.

R. M. Hill, "Electrical Conduction in Ultra Thin Metal Films. I. Theoretical," Proc. of Royal Society of London Ser. A, vol. 309, No. 1498, pp. 377-395, Mar. 1969.

J. Borghetti et al., "Electrical transport & thermometry of electroformed titanium dioxide memristive switches," J. Appl. Phys., vol. 106, No. 12, pp. 124504-1-124504-5, 2009.

A. Chung et al., "Nanoscale memory devices," Nanotechnology, vol. 21, No. 41, pp. 412001, 2010.

A. Zakhidov et al., "A light-emitting memristor," Organic Electronics, vol. 11, No. 1, pp. 150-153, 2010.

W. Robinett et al., "Demultiplexers for Nanoelectronics Constructed From Nonlinear Tunneling Resistors," IEEE Trans. on Nanotechnology, vol. 6, No. 3, May 2007.

P. O. Vontobel et al., "Writing to and reading from a nano-scale crossbar memory based on memristors," Nanotechnology, vol. 20, No. 42, pp. 425204-425223, 2009.

H. Kim et al., "Memristor-based Multilevel Memory," 12th International Workshop on Cellular Nanoscale Networks & their Applications (CNNA), pp. 1-6, Feb. 2010.

C. Merkel et al., "Reconfigurable N-Level Memristor Memory Design," proc. International Joint Conf. on Neural Networks, pp. 3042-3048, 2011.

S. Remarsu et al., "On Process Variation Tolerant Low Cost Thermal Sensor Design in 32nm CMOS Technology," proc. 19th ACM Great Lakes Symp on VLSI, pp. 487-492, 2009.

S. Mukherjee et al., "The Alpha 21364 Network Architecture," IEEE Micro-Network Architecture, pp. 26-35, Jan.-Feb. 2002.

D. Brooks et al., "Wattch: A Framework for Architectural-Level Power Analysis and Optimizations," SIGARCH Computer Archit. News, vol. 28, pp. 83-94, May 2000.

J. L. Henning, "SPEC CPU2000: Measuring CPU Performance in the New Millennium," Computing Practices, pp. 28-35, 2000.

K. E. Dellaquila, "Thermal Profiling of Homogeneous Multi-Core Processors Using Sensor Mini-Networks," Master's Thesis, Rochester Institute of Technology, Aug. 2010.

D. Strukov et al., "Hybrid CMOS/Memristor Circuits," in Proc. IEEE Int. Symp. Circ. Syst., ISCAS 2010, Jun. 2010, pp. 1967-1970.

D. Strukov and K. Likharev, "CMOL FPGA: a reconfigurable architecture for hybrid digial circuits with two-terminal nanodevices," Nanotechnology, vol. 16, pp. 888-900, 2005.

G. S. Snider and R. S. Williams, "Nano/CMOS architectures using a field-programmable nanowire interconnect," Nanotechnology, vol. 18, pp. 1-10, 2007.

S.H. Jo and W. Lu, "CMOS Compatible Nanoscale Nonvolatile Resistance Switching Memory," Nano Letters, vol. 8, No. 2, pp. 392-379, 2008.

D. Strukov and R. S. Williams, "Four-dimensional address topology for circuits with stacked multilayer crossbar arrays," PNAS, vol. 106, No. 48, pp. 20155-20158, Dec. 1, 2009.

S. H. Jo et al., "Programmable Resistance Switching in Nanoscale Two-Terminal Devices," Nano Letters, vol. 9, No. 1, pp. 496-500, 2009.

Y. C. Yang et al., "Fully Room-Temperature-Fabricated Nonvolatile Resistive Memory for Ultrafast and High-Density Memory Application," Nano Letters, vol. 9, No. 4, pp. 1636-1643, 2009.

Y. Ho et al., "Nonvolatile Memristor Memory: Device Characteristics and Design Implications," Computer-Aided Design—Digest of Technical Papers, ICCAD 2009, IEEE/ACM International Conference, pp. 485-490, Nov. 2009.

H. Manem et al., "Design Considerations for Variation Tolerant Multilevel CMOS/Nano Memristor Memory," in Proc. of the 20th symposium on great lakes symposium on VLSI, ser. GLSVLSI '10, New York, NY, USA; ACM, 2010, pp. 287-292.

D. Niu et al., "Low-power Dual-element Memristor Based Memory Design," in Proc. of the 16th ACM/IEEE international symposium on low power electronics and deisgn, ser. ISLPED '10, New York, NY, USA: ACM, 2010, pp. 25-30.

W. Robinett et al., "A memristor-based nonvolatile latch circuit," Nanotechnology, vol. 21, No. 23, Jun. 2010.

International Roadmap for Semiconductors, 2009 Report. [Online}. Available: http://www.itrs.net/reports.html.

J. Srinivasan et al., "The Impact of Technology Scaling on Lifetime Reliability," in Proc. International Conference on Dependable Systems and Networks, Jun. 2004, pp. 1-10.

J. Long et al., "Thermal Monitoring Mechanisms for Chip Multiprocessors," AMC Transactions on Ar5chitecture and Code Optimization, vol. 5, No. 2, article 9, Aug. 2008.

E. Rotem et al., "Temperature measurement in the Intel Core Duo Processor," in Proc. of 12th Inter. Workshop on Thermal investigation of ICs, Sep. 2006, pp. 1-5.

A. Ajami et al., "Analysis of Non-Uniform Temerature-Dependent Interconnect Performance in High Performance ICs," in DAC '01: Proceedings of the 38th annual Design Automation.

P. Bratek and A. Kos, "Temperature Sensors Placement Strategy for Fault Diagnosis in Intergrated Circuits," pp. 245-251, 2001.

J. Altet et al., "Sensing temperature in CMOS circuits for Thermal Testing," 22nd IEEE VLSI Test Symposium, 2004, Proceedings, pp. 179-184, 2004.

J.L.Ayala,et al., "Thermal modeling and analysis of 3D multi-processor chips," Integration VLSIJ, 2010, vol. 43, No. 4, pp. 327-341.

D. Brooks et al., "Dynamic Thermal Management for High-Performance Microprocessors," High-Performance Computer Arch., 2001, HPCA, pp. 171-182.

(56) References Cited

OTHER PUBLICATIONS

E. Rotem et al., "Analysis of Thermal Monitor features of the Intel Pentium M Processor," Workshop on Temperature-aware Computer Systems, 2004.

D. Blackburn, "Temperature Measurements of Semiconductor Devices—A Review," Semiconductor Thermal Measurement & Management Symposium, 2004, 12th Annual IEEE, pp. 70-80.

R. Mukherjee et al., "Systematic Temperature Sensor Allocation and Placement for Miicroprocessors," DAC 2006, Proc. 43rd Annual Design Automation Conf., pp. 542-547.

R. Cochran et al., "Spectral Techniques for High-Resolution Thermal Characterization with Limited Sensor Data," Design Automation Conf., 46th ACM/IEEE Jul. 2009, pp. 478-483.

T. Burd, "A Dynamic Voltage Scaled Micro[rocessor System," Solid-State Circuits Conf., 2000, Digest of Technical Papers, ISSCC, 2000 IEEE International, 2000, pp. 294-295, 466.

H. Hanson et al., "Thermal Response to DVFS: Analysis with an Intel Pentium M," Low Power Electronics & Design, 2007 ACM/IEEE International Symposium, Aug. 2007, pp. 219-224.

J. Choi et al., "Thermal-aware Task Scheduling at the System Software Level," Proc. 2007 ISLPED, ACM, pp. 213-218.

J. Chen et al., "Large On-Off Ratios & Negative Differential Resistance in a Molecular Electronic Device," Science, vol. 286, No. 5444, pp. 1550-1552, 1999.

C.P. Collier et al., "Electroncially Configurable Molecular-Based Logic Gates," Science, vol. 285, No. 5426, pp. 391-394, 1999.

J. Ellenbogen et al., "Architectures for Molecular Electronic Computers: 1. Logic Structures and an Adder Designed from Molecular Electronic Diodes," IEEE, vo. 88, pp. 386-426.

C. Majumder et al., "Molecular Resistance on a Molecular Diode: A Case Study of the Substituted Phenylethynyl Oligomer," J. Phys Chem A, vol. 106, pp. 7911-7914, Jul. 2002.

Y. Chen et al., "Nanoscale molecular-switch devices fabricated by imprint lithography," Applied Physics Letters, vol. 82, No. 10, pp. 1610-1612, Mar. 2003.

M. Stan et al., "Molecular Electronics: From Devices and Interconnect to Circuits and Architecture," Proc. IEEE, vol. 91, No. 11, pp. 1940-1957, Nov. 2003.

W.-Q. Deng et al., "Mechanism of the Stoddart-Heath Bistable Rotaxane Molecular Switch," J. Amer. Chem. Soc., vol. 126, No. 42, pp. 13562-13563, 2004.

P. Kuekes et al., "The crossbar latch: Logic value storage, restoration, and inversion in crossbar circuits," J. Appl. Phys., vol. 97, No. 034301, pp. 1-5, 2005.

D. Nackashi et al., "Molecular Electronic Latches and Memories," Proc. 2005 5th IEEE Conf. on Nanotechnology, vol. 2, pp. 819-822.

G. Morales et al., Inversion of the Rectifying Effect in Diblock Molecular Diodes by Protonation,: J. Am. Chem. Soc., vol. 126, No. 30, pp. 10456-10457, 2005.

M. J. Kumar, "Molecular Diodes and Applications," Recent Patents on Nanotechnology 2007, vol. 1, No. 1, pp. 51-57, 2007.

H. He et al., "Mechanism of Electrical Rectification in a Unimolecular Donor-Bridge-Acceptor Diode," Proc. 7th IEEE International Conference on Nanotechnology, pp. 870-872.

A. Aviram et al., "Molecular Rectifiers," Chemical Physics Letters, vol. 29, No. 2, pp. 277-283, 1974.

E. Linn et al., "Complementary resistive switches for passive nanocrossbar memories," Nature Materials, vol. 9, pp. 403-406, May 2010.

G. Snider et al., "CMOS-like logic in defective, nanoscale crossbars," Nanotechnology, vol. 15, pp. 881-891, 2004.

R. Chakraborty et al., "Analysis and Robust Design of Diode-Resistor Based Nanoscale Crossbar PLA Circuits," 21st International Conf on VLSI Design, pp. 441-446, 2008.

J. Brown et al., "CAEN-BIST: Testing the NanoFabric," proc. International Test Conference, ser. ITC '04, IEEE Computer Soc., 2004, pp. 462-471.

M. Tehranipoor et al., "Built-In Self-Test and Recovery Procedures for Molecular Electronics-Based Nanofabrics," IEEE Trans., vol. 26, No. 5, pp. 943-958, May 2007.

B. Zamanlooy et al., "Modified CAEN-BIST Algorithm for Better Utilization of Nanofabrics," Electrical & Computer Engineering, 2008, ICECE 2008, pp. 297-301.

S. C. Goldstein et al., "NanoFabrics: Spatial Computing Using Molecular Electronics," SIGARCH Computer Archit. News, vol. 29, pp. 178-191, May 2001.

A. Dehon et al., "Nanowire-Based Sublithographic Programmable Logic Arrays," Proc. of 2004 ACM/SIGDA 12th Intl Symp on Field Programmable Gate Arrays, pp. 123-132.

C. Teodorov, "NanoCAD: Design Automation Methods for Emerging Nanoscale Technologies," Master's Thesis, Univ. of Bretagne Occidentale, 2008.

M. Ziegler et al., "CMOS/Nano Co-Design for Crossbar-Based Molecular Electronic Systems," IEEE Trans. Nanotechnology, vol. 2, No. 4, pp. 217-230, Dec. 2003.

\* cited by examiner

THERMAL MANAGEMENT APPARATUSES WITH TEMPERATURE SENSING RESISTIVE RANDOM ACCESS MEMORY DEVICES AND METHODS THEREOF

This application claims the benefit of U.S. Provisional Patent Application Ser. No. 61/501,906 filed Jun. 28, 2011, which is hereby incorporated by reference in its entirety.

FIELD

This technology generally relates to devices and methods for thermal management and, more particularly, to thermal management apparatuses with temperature sensing resistive random access memory devices and methods thereof.

BACKGROUND

With semiconductor architectures, failure mechanisms, such as electromigration and stress migration in interconnects, time-dependent dielectric breakdown, and thermal cycling accelerate with an increase in temperature. In particular, stress migration and time-dependent dielectric breakdown have an exponential temperature dependence.

Unmanaged temperatures in semiconductor architectures can create a temperature/leakage power feedback loop, yielding thermal runaway. High temperatures also can create timing errors and clock skew, and affect carrier mobility and threshold voltage in MOSFETs. Accordingly, it is very important to monitor and manage on-chip temperatures in order to maximize device lifetimes and assure computational correctness.

Temperature also can be used as an observable test output for determining defective integrated circuit components. In a many-core platform, chip hotspots are workload-dependent. In order to maximize performance and reliability in these devices, tasks should be scheduled in a thermally-aware manner so that hotspot temperatures do not exceed a set threshold value and thermal gradients are minimized.

The goal of thermal management is monitor and mange temperatures to maximize device performance while minimizing temperature gradients. Reducing temperatures and thermal gradients can be achieved through thermal-aware design or dynamic thermal management (DTM). In thermal-aware design, materials, physical structures, and floor plans are chosen so that thermal gradients are minimized. For example, a grid structure has been proposed to evenly distribute heat across an integrated circuit via lateral diffusion. Another example of thermal-aware design is the placement of L2 cache between cores in a multi-core system to thermally insulate them from each other.

Dynamic thermal management in integrated circuits roughly can be split into two domains: triggering mechanisms and response mechanisms. The goal of a triggering mechanism is to measure or estimate on-chip temperatures and trigger a hardware or software-level response which is a function of those temperatures. Temperature measurements are achieved with analog or digital on-chip temperature sensors. On-chip temperatures also can be indirectly estimated through static compile-time code profiling or high-level dynamic performance analysis. Purely indirect estimations lack any real temperature feedback and can only yield relative temperature information which are not sufficient for applications where absolute temperature measurements are required.

The goal of a response mechanism is to maximize device reliability while minimizing performance degradation. In this domain, certain actions may need to take place in order to reduce hot spot temperatures or minimize thermal gradients. The main tradeoff in this domain is system reliability vs. performance.

SUMMARY

A thermal management apparatus includes one or more temperature sensing and memory devices and a thermal management processing device. Each of the temperature sensing and memory devices has one or more memristors which each have at least a first state and a second state. The thermal controller device is coupled to each of the temperature sensing and memory devices and is configured to record a write time for one or more of the memristors to transition from one of the first and second states to the other one of the first and second states. The thermal management processing device is coupled to the thermal controller device and includes at least one of configurable hardware logic configured to be capable of implementing or a processor coupled to a memory and configured to execute programmed instructions stored in the memory comprising: issuing a timer record instruction and a write instruction with a write address to the thermal controller device to record the write time for the one of the memristors at the write address to transition from the one of the first and second states to the other one of the first and second states; receiving from the thermal controller device the recorded write time in response to the issued timer record instruction and the issued write instruction; determining a temperature of the one of the one or more memristors at the write address based on the received recorded write time; and providing the determined temperature of the one of the one or more memristors at the write address.

A method for making a thermal management apparatus includes providing one or more temperature sensing and memory devices each with one or more memristors each having at least a first state and a second state. A thermal controller device is coupled to each of the temperature sensing and memory devices and is configured to record a write time for one or more of the memristors to transition from one of the first and second states to the other one of the first and second states. A thermal management processing device is coupled to the thermal controller device and includes at least one of configurable hardware logic configured to be capable of implementing or a processor coupled to a memory and configured to execute programmed instructions stored in the memory comprising: issuing a timer record instruction and a write instruction with a write address to the thermal controller device to record the write time for the one of the memristors at the write address to transition from the one of the first and second states to the other one of the first and second states; receiving from the thermal controller device the recorded write time in response to the issued timer record instruction and the issued write instruction; determining a temperature of the one of the one or more memristors at the write address based on the received recorded write time; and providing the determined temperature of the one of the one or more memristors at the write address.

A method for managing temperature includes issuing by a thermal management processing device a timer record instruction and a write instruction with a write address to a thermal controller device to record the write time for one of a plurality of memristors at the write address to transition from one of a first and second states of each of the memristors to the other one of the first and second states. The recorded write time in response to the issued timer record instruction and the issued write instruction is received by the thermal management processing device. A temperature of the one of the one or more memristors at the write address is determined by the thermal management processing device based on the received recorded write time. The determined temperature of the one of the one or more memristors at the write address is provided by the thermal management processing device.

A non-transitory computer readable medium having stored thereon instructions for managing temperature comprising machine executable code which when executed by at least one processor, causes the processor to perform steps including issuing a timer record instruction and a write instruction with a write address to a thermal controller device to record the write time for one of a plurality of memristors at the write address to transition from one of a first and second states of each of the memristors to the other one of the first and second states. The recorded write time in response to the issued timer record instruction and the issued write instruction is received. A temperature of the one of the one or more memristors at the write address is determined by the thermal management processing device based on the received recorded write time. The determined temperature of the one of the one or more memristors at the write address is provided.

This technology provides a number of advantages including providing more efficient and effective thermal management apparatuses with temperature sensing resistive random access memory devices for semiconductor architectures. With this technology, the temperature sensing resistive random access memory devices can easily be incorporated in a layer, such as with a nanowire crossbar and memristor architecture, above the active layer to yield lower area overhead. Since the memristors do not require a voltage to retain their state, less power is consumed than with traditional temperature sensors. Further, the nanowire crossbar and memristor architecture as illustrated and described in examples herein enables a very high density placement of temperature sensors for thermal management.

This technology also can provide accurate temperature profiles which can be used for a variety of applications including: dynamic thermal management; stand-alone temperature sensing; prevention of power or temperature-based side channel security attacks; on-chip security, reliability management; integrated circuit testing; and hardware security/Trojan detection and energy efficient three-dimensional integrated circuit designs by way of example only. Additionally, this technology can be used in combination with other traditional thermal sensors.

DETAILED DESCRIPTION

Figure 1:
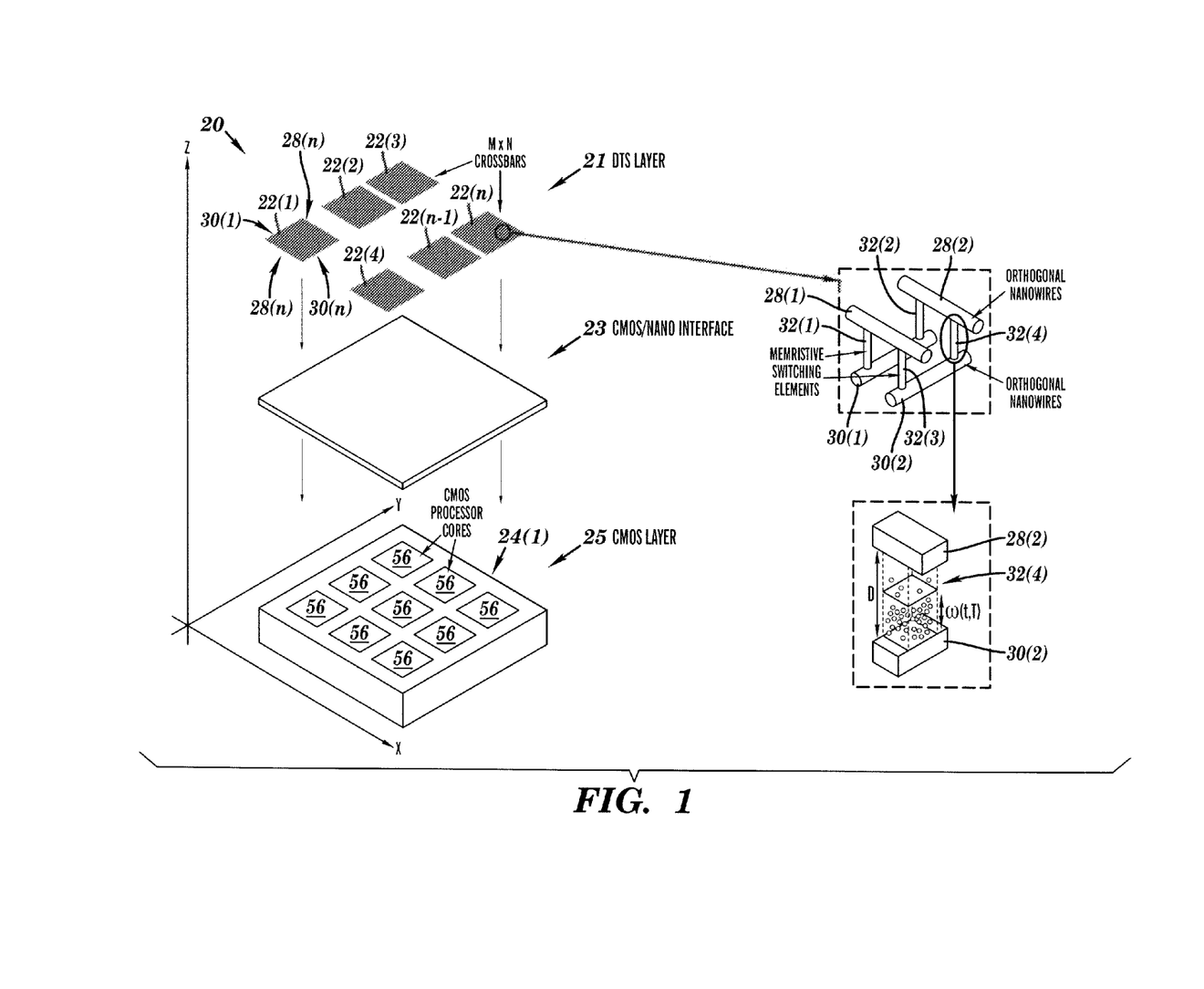
FIG. 1 is an exploded view of an exemplary thermal management apparatus with enlarged views of a portion of an exemplary temperature sensing resistive random access memory device.
Figure 2:
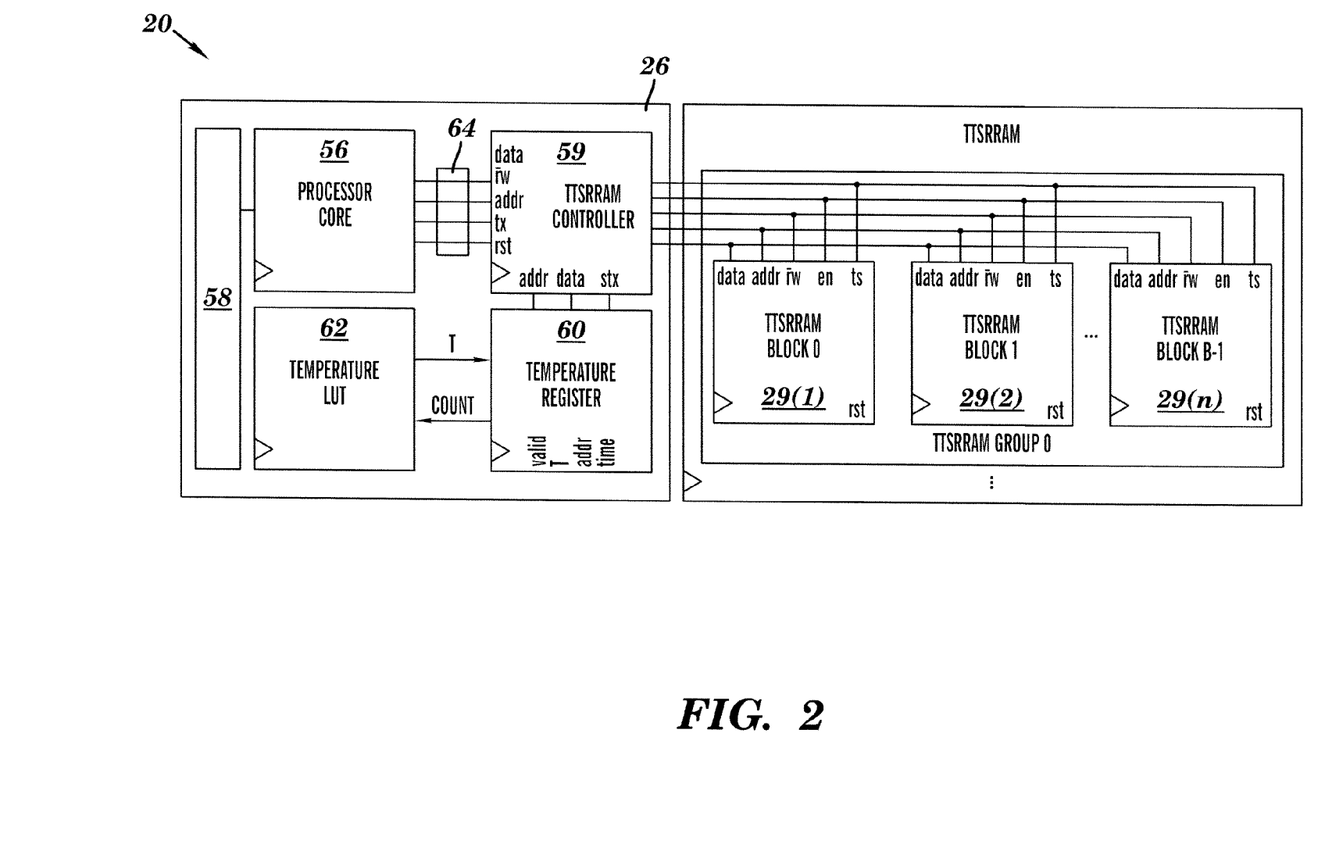
FIG. 2 is a block diagram of the exemplary thermal management apparatus shown in FIG. 1.
Figure 3:
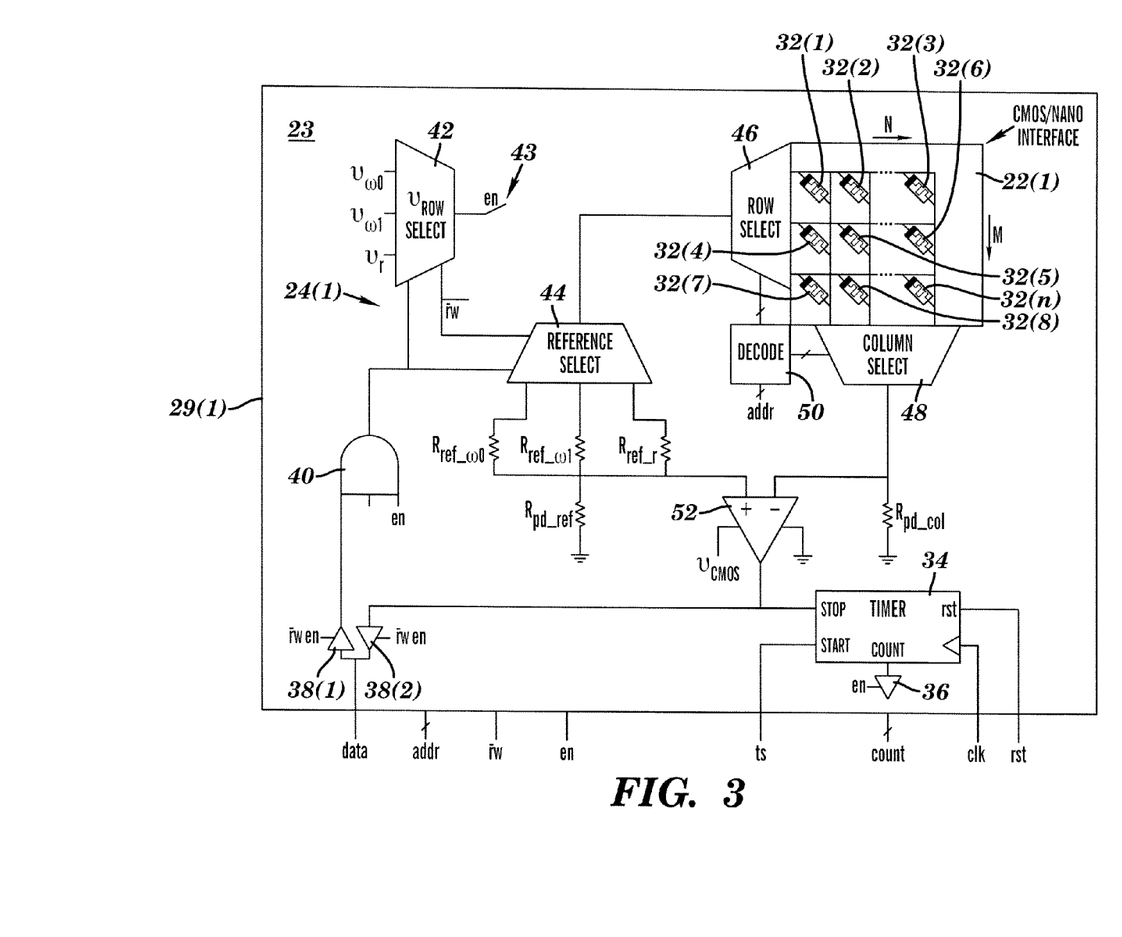
FIG. 3 is a block diagram of a temperature sensing resistive random access memory block for the thermal management apparatus shown in FIGS. 1 and 2.

An exemplary thermal management apparatus 20 is illustrated in FIGS. 1-3. The thermal management apparatus 20 includes a dual-purpose temperature sensing/memory (DTS) layer 21 with a plurality of temperature sensing resistive random access memory devices 22(1)-22(n), an intermediate interface layer 23, and a CMOS layer 25 with a thermal device controller 24(1) and a thermal management processing device 26, although the thermal management apparatus could include other types and numbers of layers fabricated with different process technologies and could include other types and numbers of systems, devices, components, and other elements in other configurations. This technology provides a number of advantages including providing more efficient and effective thermal management apparatuses with temperature sensing resistive random access memory devices for semiconductor architectures.

The dual-purpose temperature sensing/memory (DTS) layer 21 stores data in the form of a resistance and senses temperature at different locations on a chip or other substrate. The intermediate layer 23 serves as an interface between the DTS layer 21 and the CMOS layer 25 and uses techniques such as area-distributed interfacing and demultiplexing by way of example only, to provide support for addressing each crosspoint junction in the DTS layer 21 from the CMOS layer 25. The CMOS layer 25 determines temperature based on write time and performs other thermal management processing operations.

Referring more specifically to FIGS. 1-3, the thermal management apparatus 20 includes the plurality of temperature sensing resistive random access memory devices 22(1)-22(n) which can be arranged as one or more groups, although other types and numbers of temperature sensing and memory devices can be used. Each of the temperature sensing resistive random access memory devices 22(1)-22(n) comprises a first plurality of spaced apart nanowires 28(1)-28(n), a second plurality of spaced apart nanowires 30(1)-30(n), and a plurality of memristors 32(1)-32(n), although each of the temperature sensing resistive random access memory devices could comprise other types and numbers of systems, devices, components, and other elements in other configurations. The first plurality of spaced apart nanowires 28(1)-28(n) extend along a first plane and the second plurality of spaced apart nanowires 30(1)-30(n) are arranged to be substantially orthogonal to the first plurality of spaced apart nanowires 28(1)-28(n) and extend along a second plane which is spaced from the first plane, although the first plurality of spaced apart nanowires 28(1)-28(n) and the second plurality of spaced apart nanowires 30(1)-30(n) could have other orientations and spacings. The plurality of memristors 32(1)-32(n) are spaced apart between the first plurality of spaced apart nanowires 28(1)-28(n) and the second plurality of spaced apart nanowires 30(1)-30(n) with one end of each of the plurality of memristors 32(1)-32(n) coupled to one of the first plurality of spaced apart nanowires 28(1)-28(n) and another end of each of the plurality of memristors 32(1)-32(n) coupled to one of the second plurality of spaced apart nanowires 30(1)-30(n).

Each of the temperature sensing resistive random access memory devices 22(1)-22(n) provides a bit-addressable RRAM memory with added support for temperature sensing based on the temperature dependencies of one or more ion mobility, ion diffusivity, and carrier transport of the memristors 32(1)-32(n), although other types of devices with other types of temperature dependencies could be used. In this particular example, a write time of each of the memristors 32(1)-32(n) depends on these temperature dependencies. By way of example only, another approach would be to write the memristor 32(1)-32(n) to a high resistance state and then measure the average velocity of a domain wall for the memristors 32(1)-32(n) over a period of time which then could be correlated to a temperature reading. An analog-to-digital (ADC) converter would be needed to extract the velocity information. In this approach, there is a conflict of interest. For memory storage and, specifically, high retention times, the ion activation energy of the memristors 32(1)-32(n) needs to be sufficiently high. However, a high activation energy will yield very small domain wall movements due to ionic self-diffusion. Therefore, this alternative approach is not best-suited for a dual-purpose design.

The thermal controller device 24(1) is in the layer 25 and the temperature sensing resistive active memory device 22(1) is in layer 21 and together in this example form temperature sensing resistive random access memory block 29(1), although the temperature sensing resistive random access memory block can comprise other types and numbers of systems, devices, components and other elements in the same or other numbers of layers. In this particular example, all of the blocks 29(1)-29(n) are the same in structure and operation, although one or more of the blocks could have a different structure and/or operation, such as the exemplary temperature sensing resistive random access memory block 39 illustrated and described with reference to FIG. 5.

The thermal controller device 24(1) acts as an interface between the plurality of temperature sensing resistive random access memory devices 22(1)-22(n) and the thermal management processing device 26 and controls the operations of the temperature sensing resistive random access memory devices 22(1)-22(n). In this particular example, the thermal controller device 24(1) includes a timer device or timer device 34, a count tri-state buffer 36, read/write enables tri-state buffers 38(1)-38(2), an AND gate 40, a Vrow select multiplexer 42, an enable switch 43, a reference select multiplexer 44, a row select multiplexer 46, a column select multiplexer 48, a decode 50, an operational amplifier 52 and resistors Rref w0, Rref w1, Rref$_r$, Rpd ref, and Rpd col, although the thermal controller device 24(1) could include other types and numbers of layers and could include other types and numbers of systems, devices, components, and other elements in other configurations.

In this particular example, a reset input "rst" of the timer device 34 is coupled to receive a reset signal "rst", a clock input of the timer device 34 is coupled to receive a clock signal "clk", and a start input "start" of the timer device 34 is coupled to a timer start signal "ts". Additionally, a count output "count" of the timer device 34 is coupled to an input of the count tri-state buffer 36 and an output of the count tri-state buffer 36 is coupled to output a count signal "count". A stop input "stop" of the timer device 34 is coupled to an input of the tri-state buffer 38(2) whose output is coupled to output a data signal "data". An input of the tri-state buffer 38(1) is coupled to receive input data "data" and has an output coupled to an input of the AND gate with inputs for a read/write "rw" signal and an enable "en" signal. An output of the AND gate 40 is coupled to an input of the Vrow select multiplexer 42 and the reference select multiplexer 44. The Vrow select multiplexer 42 also has inputs from Vwo, Vwl and Vr, is also coupled to pass a read/write control signal to the reference select multiplexer 44. The enable switch 43 has open and closed states and is coupled between the outputs of the Vrow select multiplexer 42 and the reference select multiplexer 44 with the output of the reference select multiplexer 44 also coupled to an input of the row select multiplexer 46. Resistors Rref w0, Rref w1, Rref$_r$, are coupled between inputs to the reference select multiplexer 44 and the resistor Rpd ref which is coupled to ground. The decoder device or "decode" 50 has an output coupled to the row select multiplexer 46 and the column select multiplexer 48 and is coupled to receive an address input "addr". The row select multiplexer 46 and the column select multiplexer 48 are configured to be able to address and selectively connect to each of the memristors 32(1)-32(n). An input to the column select multiplexer 48 is coupled to a resistor Rpd col which is coupled to ground and to a negative terminal of operational amplifier 52. A positive terminal of operational amplifier 52 is coupled to resistors Rref w0, Rref w1, Rref$_r$, and Rpd ref. An output of operational amplifier 52 is coupled to the stop input "stop" of the timer device 34 is coupled to the input of the tri-state buffer 38(2). Although one example of the types of components and their interconnections for the thermal controller device 24(1) are illustrated in this example, the thermal controller device 24(1) can have other types and numbers of systems, devices, components, and elements in other configurations.

Figure 5:
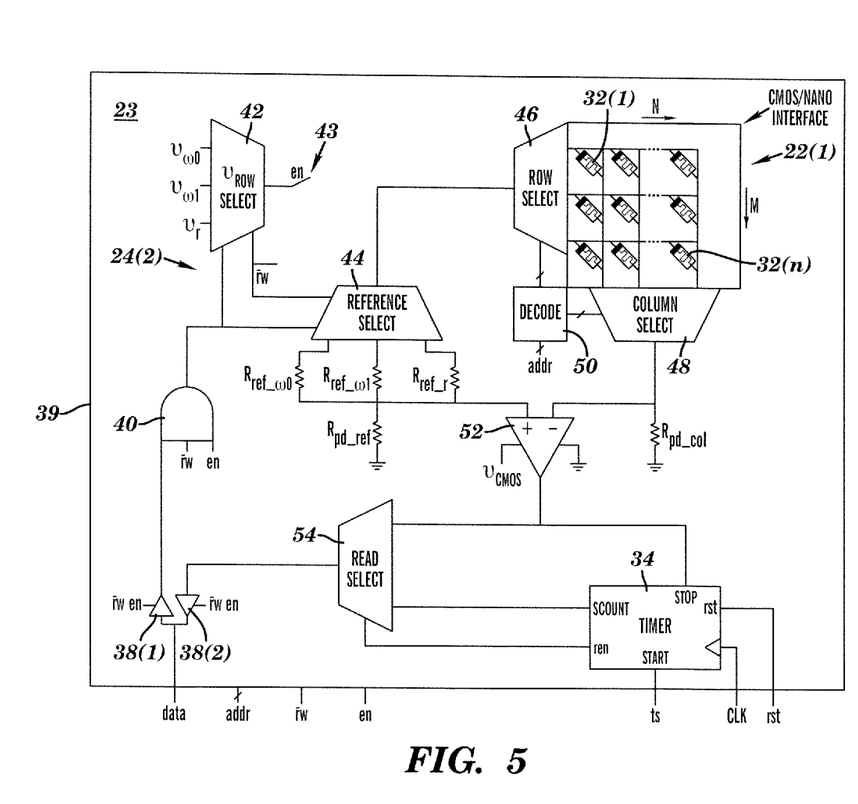
FIG. 5 is a block diagram of another exemplary temperature sensing resistive random access memory block.

By way of example only, the other example of a temperature sensing resistive random access memory block 39 is illustrated in FIG. 5. In block 39, the thermal controller device 24(2) is identical in structure and operation, except as illustrated and described herein. Elements in the thermal controller device 24(2) which are like those in the thermal controller device 24(1) will have like reference numerals and will not be described again. In this example, the thermal controller device 24(2) has a read select multiplexer 54. An output of the operational amplifier 52 is coupled to an input of the read select multiplexer 54 and to the stop input "stop" of the timer device 34. In this example, the count output "count" of the timer device 34 is coupled to an input of the read select multiplexer 54 and a read enable "Ren" output of the timer device 34 also is coupled to control the read select multiplexer 54. An output of the read select multiplexer is coupled to an input of the tri-state buffer 38(2).

Accordingly, a thermal management device 20 with block 39 with thermal controller device 24(2) eliminates a dedicated timer data bus which is found in the thermal controller device 24(1), and instead uses the memory data bus to transmit timer data serially, greatly reducing the routing complexity. However, with this modification n extra clock cycles will be added to the write time latency to transmit the timer data.

In this particular example, the thermal management processing device 26 is a general-purpose processor and may execute any instruction provided in the architecture's instruction set as illustrated and described with the examples herein, although other types and numbers of processing units could be used. The thermal management processing device 26 includes a processor core or processor 56, a memory 58, a temperature register 60, a temperature lookup table 62, an interface system 64, and a controller 59 which are coupled together by a bus or other link, although other numbers and types of systems, devices, components, and elements in other configurations and locations can be used. The processor 56 in the web thermal management processing device 26 executes a program of stored instructions for one or more aspects of the present technology as described and illustrated by way of the examples herein, although other types and numbers of processing devices and/or configurable logic could be used to execute or otherwise implement these steps and/or the processor 56 could execute other numbers and types of programmed instructions.

The memory 58 in the thermal management processing device 26 stores these programmed instructions and data for one or more aspects of the present technology as described and illustrated herein, although some or all of the programmed instructions and data could be stored and executed elsewhere and other types and amounts of instructions and data could be stored. A variety of different types of memory storage devices, such as a random access memory (RAM) or a read only memory (ROM) in the system or a floppy disk, flash memory, solid state memory, hard disk, CD ROM, DVD ROM, or other computer readable medium which is read from and written to by a magnetic, optical, or other reading and writing system that is coupled to the processor 56 in the thermal management processing device 26, can be used for the memory 58. Additionally, these exemplary processes as illustrated and described herein could be executed partly or wholly by other systems, devices, components or other elements. As described in greater detail herein, the thermal management processing device 26 also includes in this example the temperature register 60 which can receive and store temperatures and other data and the temperature lookup table 62 can be calibrated and used to correlate recorded write times to temperatures, although other types and numbers of registers and/or tables can be used.

The interface system 64 in the thermal management processing device 26 is used to operatively couple and communicate between the thermal management processing device 26 and the thermal controller device 24(1) and the temperature sensing resistive random access memory devices 22(1)-22(n) via one or more connections, although other types and numbers of connections or other communication networks in other configurations could be used. In this particular example, the interface system 64 comprises a plurality of connectors, although other types and numbers of interface systems comprising other systems, devices, components and elements could be used.

The controller 59 in the thermal management processing device 26 is logic which is coupled to interface with each of the temperature sensing resistive random access memory devices 22(1)-22(n). In this particular example, the controller 59 comprises logic configured to act as the interface with respect to instructions being executed and data, such as recorded write times by way of example only, being transmitted and received, although other types and numbers of controllers could be used.

Although examples of the temperature sensing resistive random access memory devices 22(1)-22(n), the thermal controller device 24(1), and the thermal management processing device 26 are described herein, each of these devices can be implemented on any suitable computer system or computing device and/or other configurable hardware. It is to be understood that the devices and systems of the examples described herein are for exemplary purposes, as many variations of the specific hardware and software used to implement the examples are possible, as will be appreciated by those skilled in the relevant art(s).

Furthermore, each of the systems of the examples may be conveniently implemented using one or more general purpose computer systems, microprocessors, digital signal processors, micro-controllers, and configurable logic, programmed or otherwise configured according to the teachings of the examples, as described and illustrated herein, and as will be appreciated by those ordinary skill in the art.

In addition, two or more computing systems or devices or other configurable hardware can be substituted for any one of the systems in any embodiment of the examples. Accordingly, principles and advantages of distributed processing, such as redundancy and replication also can be implemented, as desired, to increase the robustness and performance of the devices and systems of the examples. The examples may also be implemented on computer system or systems or other configurable hardware that extend across any suitable network using any suitable interface mechanisms and communications technologies, including by way of example only telecommunications in any suitable form (e.g., voice and modem), wireless communications media, wireless communications networks, cellular communications networks, G3 communications networks, Public Switched Telephone Network (PSTNs), Packet Data Networks (PDNs), the Internet, intranets, and combinations thereof.

Portions of the examples executing or otherwise configured to execute programmed instructions also may be embodied as non-transitory computer readable medium having instructions stored thereon for one or more aspects of the present technology as described and illustrated by way of the examples herein, as described herein, which when executed by a processor, cause the processor to carry out the steps necessary to implement the methods of the examples, as described and illustrated herein.

Referring now to FIGS. 1-4, an exemplary finite state machine (FSM) for the timer device 34 in the thermal controller device 24(1) is illustrated. After a reset signal is received at the reset input "rst" of the timer device 34, the timer is in the STOPPED state. In the STOPPED state, the count value is fixed at its last value.

Figure 4:
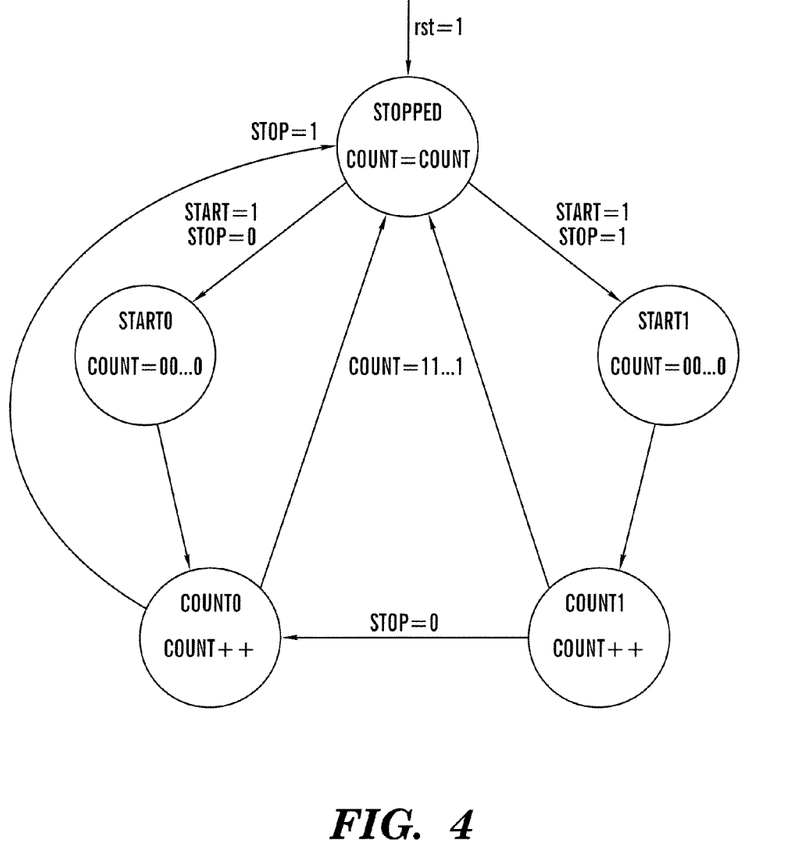
FIG. 4 is a state diagram of exemplary timing for the timer in the temperature sensing resistive random access memory device shown in FIG. 3.

When a start timer "ts" signal transitions to a logic high value at the start input "start" for the timer device 34, then the state machine transitions to either the START0 or START1 state, depending on the current value of the memory bit comprising the addressed one of the memristors 32(1)-32(n) being written to. For example, if the memory bit is being written from 0 to 1, then the FSM will transition into the START0 state.

Once the memory value is written, the output of the operational amplifier 52 comprising the read circuit will transition to a logic high and the timer device 34 will be stopped. In the case of the memory bit comprising the addressed one of the memristors 32(1)-32(n) being written from 1 to 0, the initial output of the operational amplifier 52 comprising the read circuit will be 1. When the negative write voltage vw0 is applied to the Vrow select multiplexer 42, the output will switch to 0 and after the bit is written the comparator output will switch back to 1. This behavior accounts for the slight difference in the sequence of states in FIG. 4 when writing from 0 to 1 or 1 to 0.

Referring now to FIGS. 1-4 and 7, an exemplary method for sensing and managing temperatures with the thermal management apparatus 20 will now be described. Initially, when the temperature sensing resistive random access memory devices 22(1)-22(n) are idle, the enable signal "en" to the thermal controller device 24(1) should be low. This cuts off the one of the temperature sensing resistive random access memory devices 22(1)-22(n) with the currently selected one of the memristors 32(1)-32(n) from the data bus and grounds in the thermal controller device 24(1).

Figure 7:
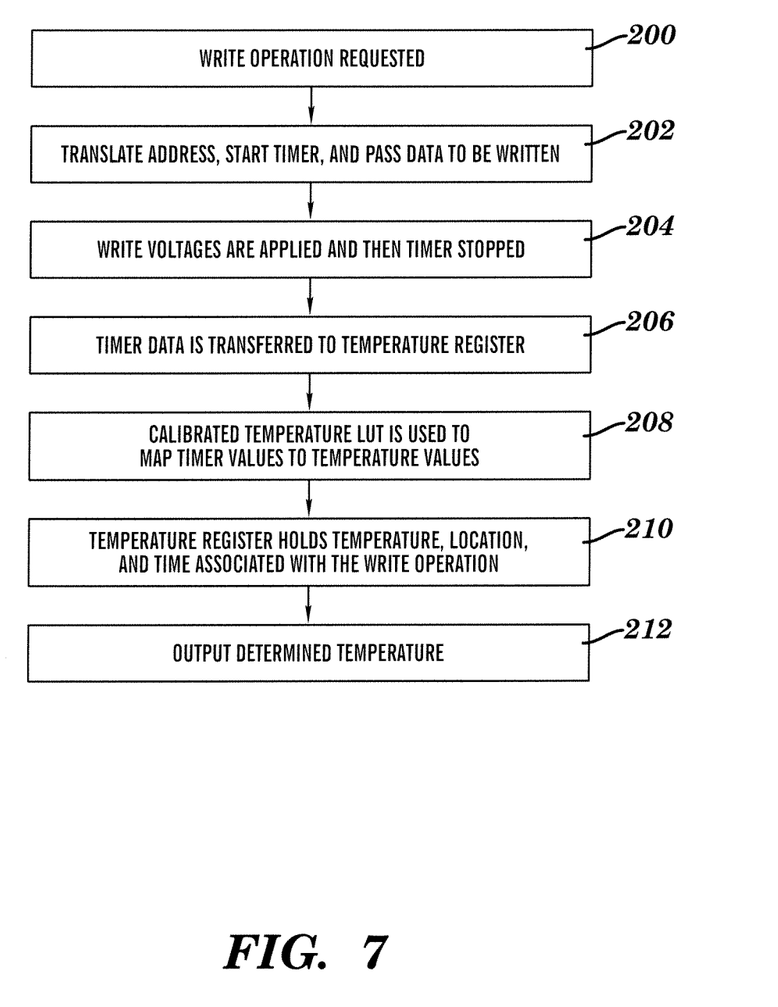
FIG. 7 is a flow chart of a method for sensing and managing temperatures with the thermal management apparatus with temperature sensing resistive random access memory devices.

In step 200, when the processor 56 in the thermal management processing device 26 issues a write operation addressed to one of the memristors 32(1)-32(n), a transition from the idle state is initiated.

In step 202, the thermal controller device 24(1) receives and translates the write operation from the processor 56 addressed to one or more of the memristors 32(1)-32(n) into control signals. Additionally, the thermal controller device 24(1) provides the signal to the start input "start" of the timer device 34 to start the timer to record a write time.

In step 204, the thermal controller device 24(1) writes the data to the addressed one of the memristors 32(1)-32(n). During the write operation, the enable "en" input and the read/write "⁻rw" input of tri-state buffer 38(1) are high. A write voltage is selected by the thermal controller device 24(1) depending on the data to be written to the addressed one of the memristors 32(1)-32(n). A positive write voltage is selected by the thermal controller device 24(1) if the data signal is high, which will make a domain wall of the addressed one of the memristors 32(1)-32(n) move into a low resistance state. A negative write voltage is selected by the thermal controller device 24(1) if the data signal is low, which will make the domain wall of the addressed one of the memristors 32(1)-32(n) move into a high resistance state.

In step 206, the write time recorded by the timer 34 in the thermal controller device 24(1) is transmitted to the controller 59 and then to the temperature register 60 of the thermal management processing device 26 for storage. Additionally, the data stored by the currently selected one of the memristors 32(1)-32(n) is read and output for storage by to the temperature register 60. With respect to the write time, the timer 34 is configured to capture the write time of each bit stored by the memristors 32(1)-32(n) that changes. With respect to obtaining a data output, a read operation is initiated by the thermal controller device 24(1) setting the enable signal "en" high and the read/write signal "⁻rw" low. This selects the read voltage, $v_r$, to be applied to the positive terminal of the selected one of the memristors 32(1)-32(n) at the row and column specified by the address. The read voltage should be small enough so that it does not disturb the state of the addressed one of the memristor 32(1)-32(n). The resulting voltage across Rpd col is compared to a reference voltage. The reference voltage is given by the voltage division $$v_{ref} = v_{row} \frac{R_{pd\_ref}}{R_{ref\_i} + R_{pd\_ref}} \quad (4.1)$$

where $v_{row}$ is the voltage applied to the selected crossbar row, and Rref i is either Rref r, Rref w0, or Rref w1, depending on the operation. Assuming Rpd ref=Rpd col, then Rref i=$R_m$(x), where x is the desired domain wall location that separates logic low from logic high. In the case of the read operation, a reasonable boundary is at x=0.5, so Rref r=0.5$R_{on}$+0.5 Roff. Accordingly, the output from the operational amplifier 52 as a result of these inputs reads out the data on the addressed one of the memristors 32(1)-32(n).

In step 208, the thermal management processing device 26 uses a pre-calibrated lookup table (LUT) 62 to map the recorded write time to a temperature. Due to the combination of process variations and material defects, the write time at a specific temperature for each of the memristors 32(1)-32(n) will vary. By way of example only, in a linear ionic drift memristor model, the write time depends on the on and off resistances, the film thickness, and the ion mobility of the corresponding one of the memristors 32(1)-32(n). As operating temperatures increase, the write time for each of the memristors 32(1)-32(n) will also become more dependent on the ionic diffusion coefficient. The write speed is most sensitive to the film thickness for each of the memristors 32(1)-32(n).

Accordingly, before use of the thermal management apparatus 20 an optional calibration process can be used to mitigate the effect of process variations on temperature measurements. By way of example only, with one calibration process the memristors 32(1)-32(n) will be placed in a thermally controlled environment, where they are subjected to a range of temperatures. For each temperature T, the average of the write times $^-t_T$ of each of the memristors 32(1)-32(n) will be calculated. Once calculated, these write times $^-t_w$ are mapped to a temperature T, in the temperature LUT 62.

In step 210, the determined temperature of the addressed one of the memristors 32(1)-32(n), the write address, and recorded write time are stored in the temperature register 60 by the thermal management processing device 26, although other types and amounts of data in this or other location can be stored.

In step 212, the determined temperature can be out by the thermal management apparatus 20 for a variety of different types of dynamic thermal management operations.

As discussed earlier, the operation of a thermal management device 20 with the thermal controller device 24(2) is the same as with the thermal controller device 24(1), except as illustrated and described herein. With the thermal controller device 24(2) an extra signal "ren" from the timer device 34 is provided the read select multiplexer 54 to switch the data bus driver between the read circuit output from operational amplifier 52 and the count value from the count output "count" of the timer device 34.

Figure 6:
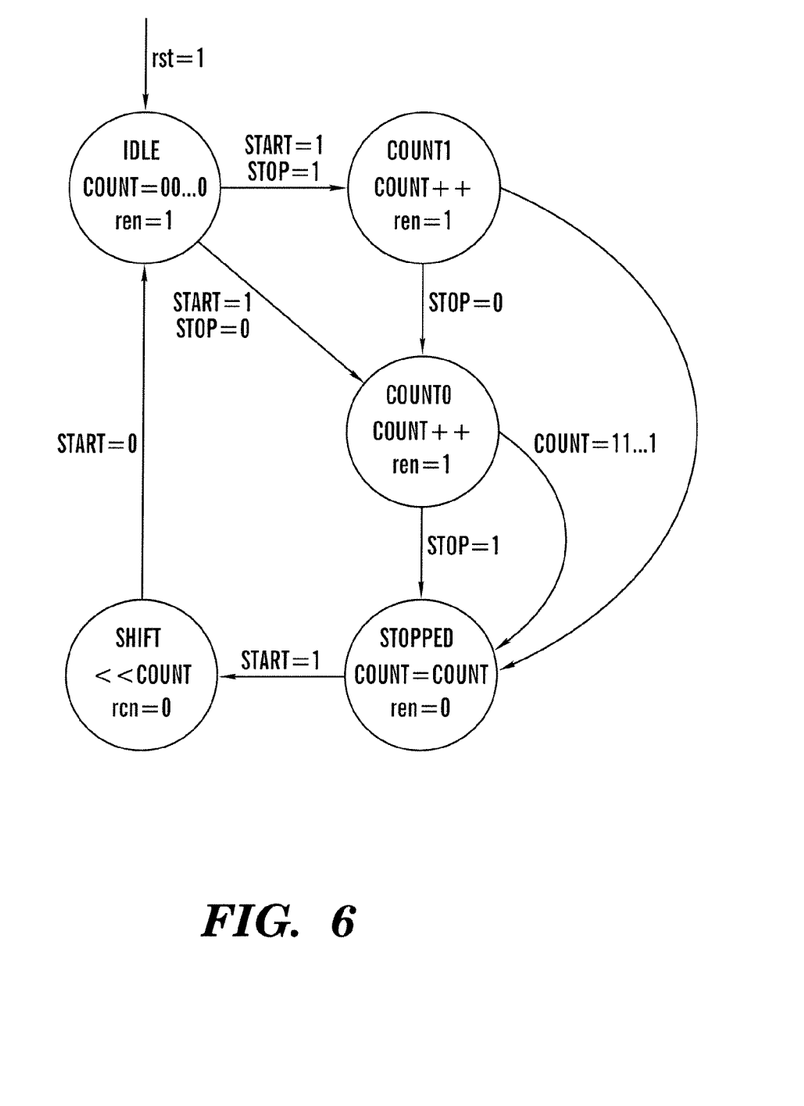
FIG. 6 is a state diagram of exemplary timing for the timer in the temperature sensing resistive random access memory device shown in FIG. 5.

A state diagram of exemplary timing for the timer in the thermal controller device 24(2) is shown in FIG. 6. In this example, the count value is now reset in the STOPPED state and a SHIFT state is added. In this state, the count value is shifted left at each clock cycle, and the data bus is driven by the MSB of the count value. In order to reduce the write time latency, the thermal controller device 24(2) may choose to only shift/transmit the most significant $m_5$ bits, where $m_5$<m, however this will reduce the accuracy of the determined temperature measurement.

Accordingly, as illustrated and described with the examples herein this technology provides more efficient and effective thermal management apparatuses with temperature sensing resistive random access memory devices for semiconductor architectures. With this technology, data is stored in temperature sensing resistive random access memory devices comprising crossbar circuits of nanowires and memristors spatially distribute over CMOS processor cores. Temperature information can be extracted from any part of the chip by measuring the write time of a memristor at an address corresponding to that location. Due to process variations, an optional calibration process can be used to map timing data to temperature information. Further, this technology allows for active and passive temperature sensing.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A thermal management apparatus comprising:
one or more temperature sensing and memory devices each comprising one or more memristors, each of the memristors having at least a first state and a second state
at least one thermal controller device coupled to each of the one or more temperature sensing and memory devices and configured to record a write time for one or more of the memristors to transition from one of the first and second states to the other one of the first and second states; and
a thermal management processing device coupled to the one or more temperature sensing and memory devices, the thermal management processing device comprising at least one of configurable hardware logic configured to be capable of implementing or a processor coupled to a memory and configured to execute programmed instructions stored in the memory comprising:
issuing a timer record instruction and a write instruction with a write address to the thermal controller device to record the write time for the one of the memristors at the write address to transition from the one of the first and second states to the other one of the first and second states;
receiving from the thermal controller device the recorded write time in response to the issued timer record instruction and the issued write instruction;
determining a temperature of the one of the one or more memristors at the write address based on the received recorded write time; and
providing the determined temperature of the one of the one or more memristors at the write address.

2. The apparatus as set forth in claim 1 wherein the temperature sensing and memory device further comprises two or more layers of offset wires forming one or more crossbars, each of the one or more memristors coupled at opposing ends to one of the two layers of crossbars.

3. The apparatus as set forth in claim 2 wherein the two or more layers of offset wires forming the one or more crossbars further comprises two or more layers of offset nanowires.

4. The apparatus as set forth in claim 1 wherein the first state of each of the one or more memristors comprises a first resistance and the second state of each of the one or more memristors is a second resistance, the first resistance is different from the second resistance.

5. The apparatus as set forth in claim 1 wherein the one or more temperature sensing and memory devices further comprises a plurality of the one or more temperature sensing and memory devices each with individually addressable ones of the memristors.

6. The apparatus as set forth in claim 1 wherein the thermal controller device further comprises:
a timer device to record the write time;
a writing device coupled to the timer device and to the memristors in the one or more temperature sensing and memory devices, the writing device configured to transition the one of the memristors at the write address from the one of the first and second states to the other one of the first and second states in response to the write instruction; and
a reading device coupled to the timer device and to the memristors in the one or more temperature sensing and memory devices, the reading device configured to detect when the one of the memristors at the write address has completed the transition from the one of the first and second states to the other one of the first and second states in response to the write instruction.

7. The apparatus as set forth in claim 6 wherein the thermal controller device further comprises one or more multiplexers coupled to the one or more memristors, the one or more multiplexers configured to process the write address.

8. The apparatus as set forth in claim 7 wherein the thermal controller device further comprises a dedicated timer bus coupled to the one or more multiplexers for outputting the received recorded write time.

9. The apparatus as set forth in claim 7 wherein the thermal controller device further comprises:
a data bus coupled to the one or more multiplexers;
a read select switching device coupled between the data bus and a data output and to the timer device, the read select switching device configured to switch an output to the data output from a reading on the one of the memristors at the write address to the recorded write time in response to a timer control signal from the timer device.

10. The apparatus as set forth in claim 1 wherein the at least one of configurable hardware logic configured to be capable of implementing or a processor coupled to a memory and configured to execute programmed instructions stored in the memory for the determining the temperature further comprising mapping the recorded write time for the one of the one or more memristors to the temperatures based on a stored lookup table.

11. The apparatus as set forth in claim 1 wherein the at least one of configurable hardware logic configured to be capable of implementing or a processor coupled to a memory and configured to execute programmed instructions stored in the memory for the providing the determined temperature further comprises storing the determined temperature, the write address in the write instruction, and the recorded write time for the one of the one or more memristors.

12. A method for making a thermal management apparatus, the method comprising:
providing one or more temperature sensing and memory devices each comprising one or more memristors, each of the memristors having at least a first state and a second state;
coupling at least one thermal controller device to each of the one or more temperature sensing and memory devices, the thermal controller device is configured to record a write time for one or more of the memristors to transition from one of the first and second states to the other one of the first and second states; and
coupling a thermal management processing device to the thermal controller device, the thermal management processing device comprising at least one of configurable hardware logic configured to be capable of implementing or a processor coupled to a memory and configured to execute programmed instructions stored in the memory comprising:
issuing a timer record instruction and a write instruction with a write address to the thermal controller device to record the write time for the one of the memristors at the write address to transition from the one of the first and second states to the other one of the first and second states;
receiving from the thermal controller device the recorded write time in response to the issued timer record instruction and the issued write instruction;
determining a temperature of the one of the one or more memristors at the write address based on the received recorded write time; and providing the determined temperature of the one of the one or more memristors at the write address.

13. The method as set forth in claim 12 wherein the providing one or more temperature sensing and memory devices further comprises providing for each of the one or more temperature sensing and memory devices two or more layers of offset wires forming one or more crossbars, each of the one or more memristors coupled at opposing ends to one of the two or more layers of crossbars.

14. The method as set forth in claim 13 wherein the two or more layers of offset wires forming one or more crossbars further comprises two layers of offset nanowires.

15. The method as set forth in claim 12 wherein the first state of each of the one or more memristors comprises a first resistance and the second state of each of the one or more memristors is a second resistance, the first resistance is different from the second resistance.

16. The method as set forth in claim 12 wherein the providing one or more temperature sensing and memory devices further comprises providing a plurality of the one or more temperature sensing and memory devices each with individually addressable ones of the memristors.

17. The method as set forth in claim 12 wherein the coupling a thermal controller device to the one or more temperature sensing and memory devices further comprises:
  providing a timer device to record the write time;
  coupling a writing device to the timer device and to the memristors in the one or more temperature sensing and memory devices, the writing device configured to transition the one of the memristors at the write address from the one of the first and second states to the other one of the first and second states in response to the write instruction; and
  coupling a reading device to the timer device and to the memristors in the one or more temperature sensing and memory devices, the reading device configured to detect when the one of the memristors at the write address has completed the transition from the one of the first and second states to the other one of the first and second states in response to the write instruction.

18. The method as set forth in claim 17 wherein the coupling a thermal controller device to the one or more temperature sensing and memory devices further comprises providing one or more multiplexers coupled to the one or more memristors, the one or more multiplexers configured to process the write address.

19. The method as set forth in claim 18 wherein the coupling a thermal controller device to the one or more temperature sensing and memory devices further comprises providing a dedicated timer bus coupled to the one or more multiplexers for outputting the received recorded write time.

20. The method as set forth in claim 18 wherein the coupling a thermal controller device to the one or more temperature sensing and memory devices further comprises further comprises providing:
  coupling a data bus to the one or more multiplexers;
  coupling a read select switching device between the data bus and a data output and to the timer device, the read select switching device configured to switch an output to the data output from a reading on the one of the memristors at the write address to the recorded write time in response to a timer control signal from the timer device.

21. The method as set forth in claim 12 wherein the at least one of configurable hardware logic configured to be capable of implementing or a processor coupled to a memory and configured to execute programmed instructions stored in the memory for the determining the temperature further comprising mapping the recorded write time for the one of the one or more memristors to the temperatures based on a stored lookup table.

22. The method as set forth in claim 12 wherein the at least one of configurable hardware logic configured to be capable of implementing or a processor coupled to a memory and configured to execute programmed instructions stored in the memory for the providing the determined temperature further comprises storing the determined temperature, the write address in the write instruction, and the recorded write time for the one of the one or more memristors.

23. A method for managing temperature, the method comprising:
  issuing by a thermal management processing device a timer record instruction and a write instruction with a write address to a thermal controller device to record the write time for one of a plurality of memristors at the write address to transition from one of a first and second states of each of the memristors to the other one of the first and second states;
  receiving by the thermal management processing device the recorded write time in response to the issued timer record instruction and the issued write instruction;
  determining by the thermal management processing device a temperature of the one of the one or more memristors at the write address based on the received recorded write time; and
  providing by the thermal management processing device the determined temperature of the one of the one or more memristors at the write address.

24. The method as set forth in claim 23 further comprising mapping by the thermal management processing device the recorded write time for the one of the one or more memristors to the temperatures based on a stored lookup table.

25. The method as set forth in claim 23 further comprising storing by the thermal management processing device the determined temperature, the write address in the write instruction, and the recorded write time for the one of the one or more memristors.

26. A non-transitory computer readable medium having stored thereon instructions for managing temperature comprising machine executable code which when executed by at least one processor, causes the processor to perform steps comprising:
  issuing a timer record instruction and a write instruction with a write address to a thermal controller device to record the write time for one of a plurality of memristors at the write address to transition from one of a first and second states of each of the memristors to the other one of the first and second states;
  receiving the recorded write time in response to the issued timer record instruction and the issued write instruction;
  determining a temperature of the one of the one or more memristors at the write address based on the received recorded write time; and
  providing the determined temperature of the one of the one or more memristors at the write address.

27. The medium as set forth in claim 26 further comprising mapping the recorded write time for the one of the one or more memristors to the temperatures based on a stored lookup table.

28. The medium as set forth in claim 23 further comprising storing the determined temperature, the write address in the write instruction, and the recorded write time for the one of the one or more memristors.

* * * * *